(12) United States Patent
Hanson

(10) Patent No.: US 11,886,234 B2
(45) Date of Patent: *Jan. 30, 2024

(54) ADAPTIVE VOLTAGE CONVERTER

(71) Applicant: AMBIQ MICRO, INC., Austin, TX (US)

(72) Inventor: Scott Hanson, Austin, TX (US)

(73) Assignee: Ambiq Micr, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 17/512,346

(22) Filed: Oct. 27, 2021

(65) Prior Publication Data
US 2022/0050491 A1 Feb. 17, 2022

Related U.S. Application Data

(63) Continuation of application No. 16/993,231, filed on Aug. 13, 2020, now Pat. No. 11,249,509, which is a
(Continued)

(51) Int. Cl.
H02M 3/158 (2006.01)
G06F 1/06 (2006.01)
(Continued)

(52) U.S. Cl.
CPC .......... G06F 1/06 (2013.01); G01R 19/0084 (2013.01); G05F 1/56 (2013.01); G05F 1/575 (2013.01);
(Continued)

(58) Field of Classification Search
CPC .... H02M 3/156; H02M 3/158; H02M 3/1588; H02M 3/155; H02M 3/1582;
(Continued)

(56) References Cited

U.S. PATENT DOCUMENTS 8,723,595 B1 * 5/2014 Chen ................. G05F 3/30 327/539
2009/0080267 A1 3/2009 Bedeschi et al.
(Continued)

OTHER PUBLICATIONS

An Improved Tail Current Course for Low Voltage Applications, IEEE Journal of Solid State Circuits, vol. 32, Issue 8, pp. 1173-1180.
(Continued)

Primary Examiner — Bryan R Perez
(74) Attorney, Agent, or Firm — Artie Pennington Law Offices, PLLC; Artie Pennington; Hannah Ward

(57) ABSTRACT

An adaptive voltage converter adapted to compensate for the exponential sensitivities of sub-threshold and near-threshold circuits. The converter can change its power/performance characteristics between different energy modes. The converter may comprise two or more voltage converters/regulators. A multiplexing circuit selects between the outputs of the several converters/regulators depending on the state of a control signal generated by a control facility. The converter is specially adapted to change the output of each converter/regulator based on a number of variables, including, for example, process corner, temperature and input voltage.

23 Claims, 4 Drawing Sheets

Related U.S. Application Data continuation of application No. 16/276,931, filed on Feb. 15, 2019, now Pat. No. 10,782,728, which is a continuation of application No. 15/516,883, filed as application No. PCT/US2015/050239 on Sep. 15, 2015, now Pat. No. 10,338,632.

(60) Provisional application No. 62/066,218, filed on Oct. 20, 2014.

(51) Int. Cl.

| | | |
|---|---|---|
| *H03L 7/18* | (2006.01) | |
| *H03L 7/06* | (2006.01) | |
| *H03L 7/181* | (2006.01) | |
| *G06F 1/3237* | (2019.01) | |
| *G06F 1/3287* | (2019.01) | |
| *G06F 1/12* | (2006.01) | |
| *G06F 11/30* | (2006.01) | |
| *G06F 11/34* | (2006.01) | |
| *G06F 13/10* | (2006.01) | |
| *G01R 19/00* | (2006.01) | |
| *G05F 1/56* | (2006.01) | |
| *H03K 17/687* | (2006.01) | |
| *H03M 1/12* | (2006.01) | |
| *H03L 7/00* | (2006.01) | |
| *G05F 1/575* | (2006.01) | |
| *G06F 1/3296* | (2019.01) | |
| *H02M 1/00* | (2006.01) | |

(52) U.S. Cl.
CPC .............. *G06F 1/12* (2013.01); *G06F 1/3237* (2013.01); *G06F 1/3287* (2013.01); *G06F 1/3296* (2013.01); *G06F 11/3041* (2013.01); *G06F 11/3414* (2013.01); *G06F 13/102* (2013.01); *H02M 3/158* (2013.01); *H03K 17/687* (2013.01); *H03L 7/00* (2013.01); *H03L 7/06* (2013.01); *H03L 7/18* (2013.01); *H03L 7/181* (2013.01); *H03M 1/12* (2013.01); *H02M 1/0045* (2021.05); *Y02B 70/10* (2013.01); *Y02D 10/00* (2018.01)

(58) Field of Classification Search
CPC .. H02M 3/157; H02M 3/1563; H02M 3/1584; H02M 1/32; H02M 1/081–084; H02M 2003/1566; H02M 2003/1557; H02M 2001/0012; H02M 2001/0009; H02M 2001/385

See application file for complete search history.

(56) References Cited

U.S. PATENT DOCUMENTS

| | | | |
|---|---|---|---|
| 2009/0295344 A1 | 12/2009 | Qu | |
| 2012/0099392 A1* | 4/2012 | Shim | G11C 5/147 365/226 |
| 2013/0188431 A1 | 7/2013 | Scheuerlein | |
| 2013/0242626 A1 | 9/2013 | Li | |
| 2013/0321068 A1* | 12/2013 | Castagna | G11C 16/30 327/536 |
| 2014/0327467 A1 | 11/2014 | Diewald et al. | |
| 2015/0042300 A1 | 2/2015 | Peker | |
| 2016/0094121 A1* | 3/2016 | Cowley | H02M 3/156 323/273 |

OTHER PUBLICATIONS

IGBT Tail Current Reduction by Current Injection Technique, Universities Power Engineering Conference, Sep. 1-4, 2008, pp. 1-4.

* cited by examiner

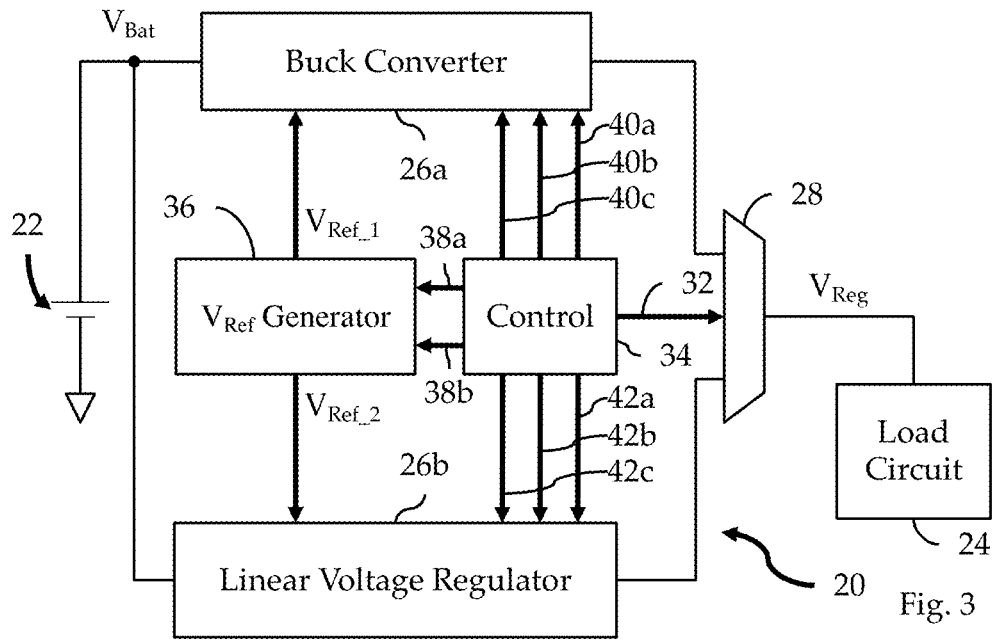
Fig. 3
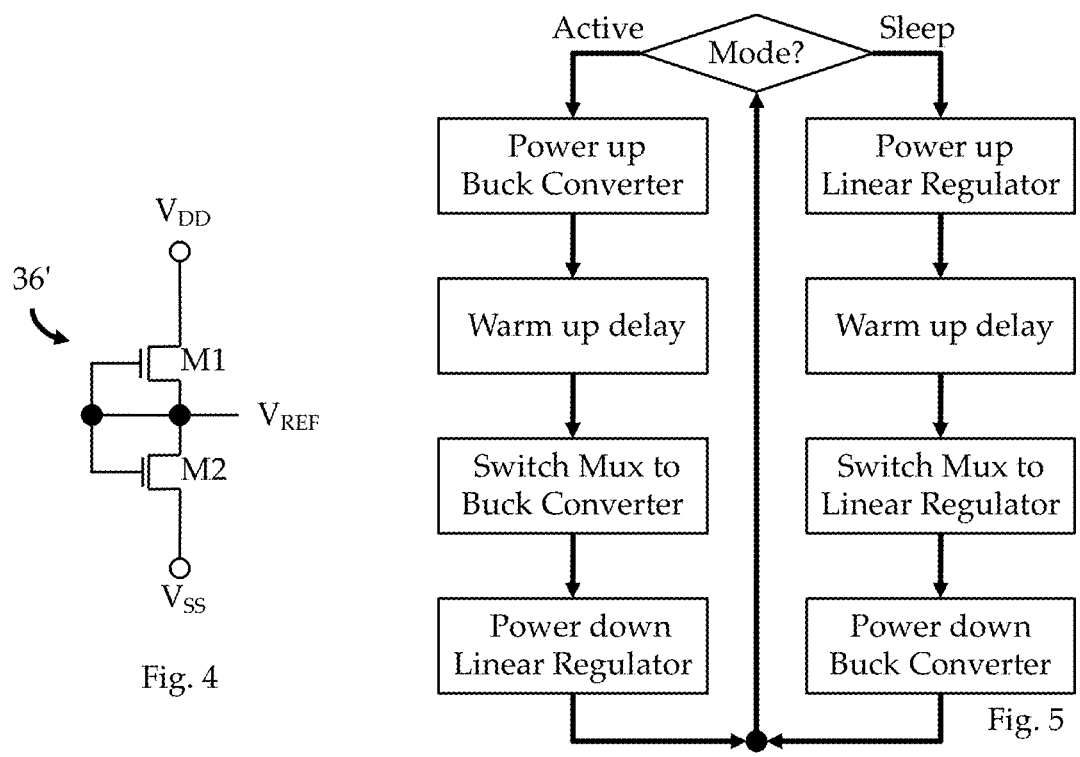
Fig. 4
Fig. 5

ADAPTIVE VOLTAGE CONVERTER

CROSS REFERENCE TO RELATED APPLICATIONS

This application is:
1. a Continuation of U.S. application Ser. No. 16/993,231, file 13 Aug. 2020 ("Third Parent U.S. Application");
2. which in turn is a Continuation of U.S. application Ser. No. 16/276,931, filed 15 Feb. 2019, now U.S. Pat. No. 10,782,728, issued 22 Sep. 2020 ("Second Parent U.S. Application");
3. which in turn is a Continuation of U.S. application Ser. No. 15/516,883, filed 4 Apr. 2017, now U.S. Pat. No. 10,338,632, issued 2 Jul. 2019 ("First Parent U.S. Application");
4. which in turn is the U.S. National Stage of PCT Application No. PCT/US15/50239, filed 15 Sep. 2015 ("Parent PCT Application");
5. which in turn is related, and claims priority to, Provisional Application No. 62/066,218, filed 20 October, 2014 ("Parent Provisional").

This application is related to U.S. application Ser. No. 14/855,105, filed 15 Sep. 2015 ("First Related Application"), now U.S. Pat. No. 9,703,313, issued 11 Jul. 2017.

This application claims priority to:
1. the Third Parent U.S. Application;
2. the Second Parent U.S. Application;
3. the First Parent U.S. Application;
4. the Parent PCT Application; and
5. the Parent Provisional;

collectively, "Priority References", and hereby claims benefit of the filing dates thereof pursuant to 37 CFR § 1.78(a)(4).

The subject matter of the Priority References and the First Related Application, each in its entirety, is expressly incorporated herein by reference.

BACKGROUND OF THE INVENTION

1. Field of the Invention

The present invention relates to an adaptive voltage converter for use with sub-threshold and near-threshold circuits.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

In the Related Application, circuits adapted to operate in the sub-threshold domain have been disclosed. Perhaps the single greatest challenge of operating circuits in the sub-threshold domain is the exponential sensitivity of circuit parameters to manufacturing process variations and operating temperature. Even circuits that operate at near-threshold voltages experience near-exponential sensitivity to temperature and process. Referring to FIG. 8, which illustrates, in graphical form, sub-threshold and near-threshold voltage ranges according to some embodiments, for the purposes of this description, near-threshold voltages shall be defined as comprising substantially the near-exponential region between about $V_{dd}=V_{th}$ and about $V_{dd}=V_{th}+0.4$ volts. These exponential sensitivities result in switching speed and power fluctuations that are intolerable in most applications. It is therefore desirable to adapt the circuit under changing process and temperature conditions to maintain constant or near-constant performance and power.

As is known, the tuning of the voltage level with respect to temperature must be carried out differently in sub-threshold and near-threshold than in super-threshold. Super-threshold circuits have a relatively low sensitivity to temperature and process variations, and tend to operate more slowly at higher temperatures. In contrast, sub-threshold circuits have exponential sensitivities to temperature and process, and actually operate faster at higher temperatures. Consequently, to maintain constant performance in a sub-threshold or near-threshold circuit across temperature, supply voltage must increase as temperature falls and decrease as temperature increases. Such a characteristic, which may or may not be substantially linear, is typically called complementary-to-absolute-temperature ("CTAT").

Adjusting the supply voltage ("$V_{DD}$") is considered to be one of the best techniques for adapting power and performance under changing process and temperature. In sub-threshold circuits, circuit speed changes exponentially with $V_{DD}$. Most circuits already have integrated voltage conversion circuitry, and this circuitry can be converted to an adaptive supply with only minimal overhead. However, what is needed is an adaptive voltage converter designed specifically to compensate for the exponential sensitivities of sub-threshold and near-threshold circuits.

Another important challenge in sub-threshold and near-threshold circuits is the extreme disparity between the power/performance requirements when a system is in an active mode and the power/performance requirements when a system is in a sleep mode. Voltage regulators are among the most important circuit blocks in a sub-threshold or near-threshold chip, and it is extremely challenging to design a single voltage converter that can simultaneously meet the bandwidth requirements of active mode and the ultra-low quiescent current requirements of sleep mode. In light of this, it is desirable to create a voltage converter that can adapt as the system moves from active mode to sleep mode. What is needed is an adaptive voltage converter that can change its power/performance characteristics between different energy modes.

BRIEF SUMMARY OF THE INVENTION

In one embodiment, a voltage conversion method adapted to deliver to a load a regulated voltage, the method comprising the steps of: developing a first tuning parameter and a second tuning parameter, the first tuning parameter being developed as a function of a process corner, and the second tuning parameter adjusts a complementary-to-absolute temperature coefficient of a sub-threshold (Vdd<Vth) regulated voltage; storing the first tuning parameter and the second tuning parameter; developing a reference voltage as a function of the first tuning parameter and the second tuning parameter; developing the sub-threshold regulated voltage as a function of the first tuning parameter, the second tuning parameter, the said reference voltage; and selecting as the regulated voltage the sub-threshold regulated voltage.

In one other embodiment, a voltage conversion method adapted to deliver to a load a regulated voltage, the method comprising the steps of: developing a first tuning parameter and a second tuning parameter, the first tuning parameter being developed as a function of a process corner, and the second tuning parameter adjusts a complementary-to-absolute temperature coefficient of a near-threshold (Vth<=Vdd<(Vth+0.4 volts)) regulated voltage; storing the first tuning parameter and the second tuning parameter; developing a reference voltage as a function of the first tuning parameter and the second tuning parameter; developing the near-threshold regulated voltage as a function of the first tuning parameter, the second tuning parameter, and the reference voltage; and selecting as the regulated voltage the near-threshold regulated voltage.

In yet another embodiment, In an adaptive voltage converter facility manufactured using a selected process having a process corner, a method comprising using the voltage conversion facility to perform the steps of: developing a tuning parameter, the tuning parameter adjusts a complementary-to-absolute temperature coefficient of a selected one of a sub-threshold (Vdd<Vth) regulated voltage and a near-threshold (Vth<=Vdd<(Vth+0.4 volts)) regulated voltage; and developing the selected one of a sub-threshold regulated voltage and a near-threshold regulated voltage as a function of the tuning parameter.

BRIEF DESCRIPTION OF THE SEVERAL VIEWS OF THE DRAWINGS

The several embodiments may be more fully understood by a description of certain preferred embodiments in conjunction with the attached drawings in which:

FIG. 3 illustrates, in block schematic form, one embodiment of an adaptive voltage converter;

FIG. 4 illustrates, in circuit diagram form, one other embodiment of a reference voltage generator;

FIG. 5 illustrates, in flow diagram form, one method for operating the adaptive voltage converter;

Figure 1:
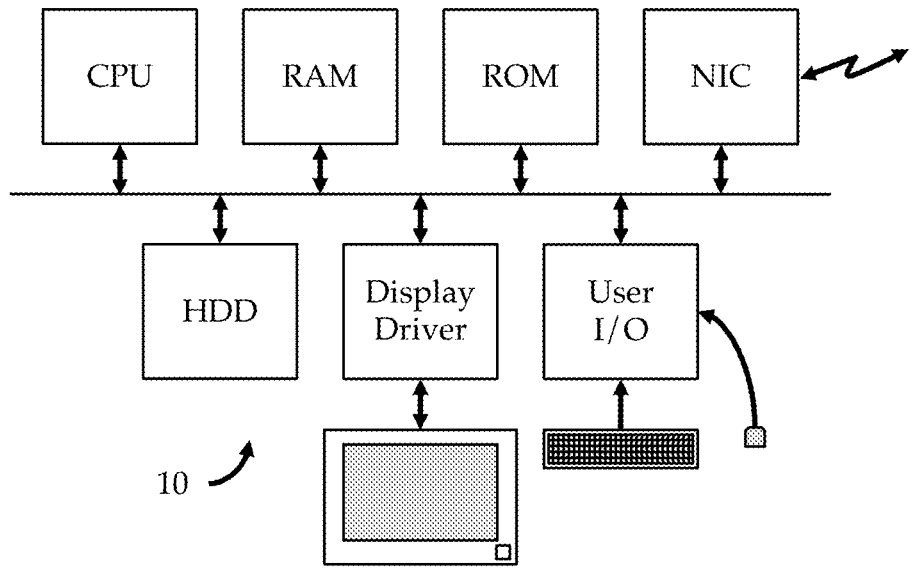
FIG. 1 illustrates, in block diagram form, a general-purpose computer system adapted to instantiate any of the several embodiments.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION OF THE INVENTION

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit chip.

Figure 2:
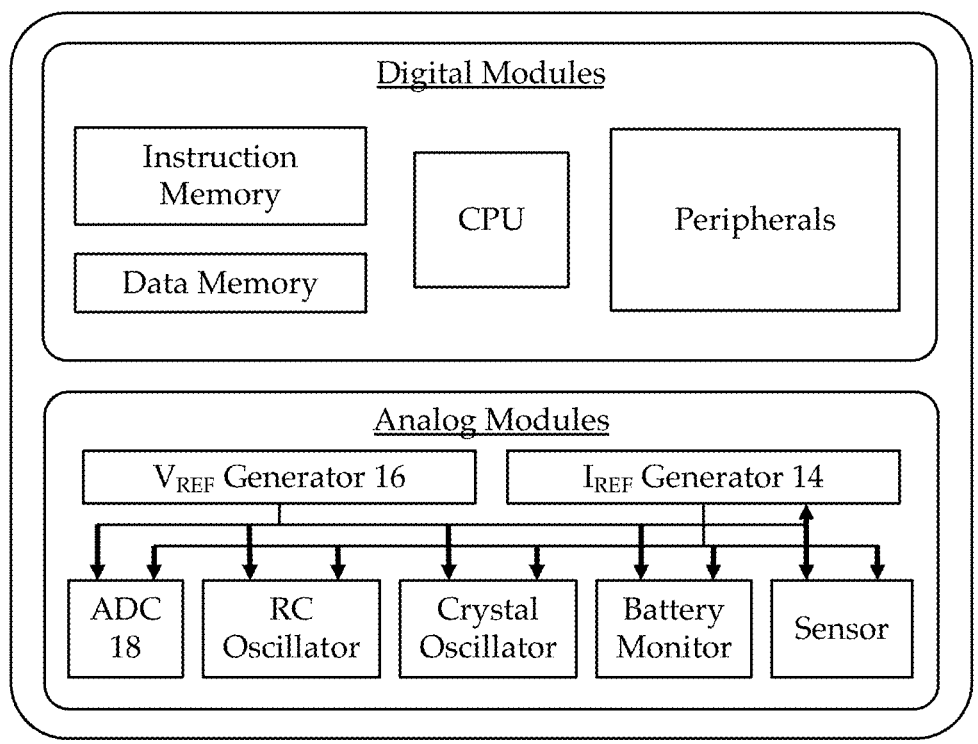
FIG. 2 illustrates, in block diagram form, a typical integrated system adapted to practice any of the several embodiments.

Shown in FIG. 2 is a typical integrated system 12 comprising, inter alia, reference voltage ("$V_{Ref}$") generator 14, reference current ("$I_{Ref}$") generator 16, several digital modules, and several analog modules. An example of an analog module is analog to digital converter ("ADC") 18. Reference voltage generator 14 and reference current generator 16 are each common modules for supplying a stable reference to such analog modules. Reference voltage generator 14 is sometimes used to derive the output reference current provided by reference current generator 16. Also, reference voltage generator 14 and reference current generator 6 may be used to supply a stable reference to modules throughout integrated system 12.

For convenience of reference, in the system illustrated in FIG. 2, one instantiation of the voltage converter 20 is illustrated. In general, the voltage converter 20 is adapted to deliver to a load, e.g., any of the several components comprising system 12, a regulated voltage having a selected one of a first current capability and a second current capability substantially less than the first current capability. In accordance with the method at least one of the first and second voltages is dynamically adjusted as a function complementary to absolute temperature.

Shown in greater detail in FIG. 3 is one embodiment of the adaptive voltage converter 20. A battery 22 supplies a voltage, $V_{Bat}$, to converter 20, which generates a lower regulated voltage, $V_{Reg}$, that may be delivered to a load circuit 24, which can be a circuit of any type. The voltage $V_{Reg}$ may be sub-threshold, near-threshold or super-threshold. In general, the converter 20 may comprise two or more voltage converters/regulators 26, of which only two are illustrated in FIG. 3. A multiplexing circuit 28 selects between the outputs of the several converters/regulators 26 depending on the state of a control signal 32 generated by a control facility 34. Control 34 also selectively enables and/or disables each of the converters/regulators 26; and a voltage reference $V_{Ref}$ generator 36. In addition to basic voltage regulation, the converter 20 may be adapted to change the output of each converter/regulator 26 based on a number of variables, including, for example, process corner, temperature and input voltage. Details of important elements and variants of the invention will described below, as will a specific implementation.

As has been noted, in the embodiment illustrated in FIG. 3, converter 20 comprises two converters: a buck converter 26a for high-efficiency conversion during active mode, and a linear voltage regulator 26b for ultra-low quiescent current operation during sleep mode. If one of the converters 26 is in use, it would be typical to power down the other unused converter 26 to save energy. In this embodiment, the buck converter 26a will generally be enabled when the system 12 is in active mode with loads on the order of 100 μA to 5 mA. In such a mode, buck converter 26a is capable of delivering power at a variety of voltages (including sub-threshold and near-threshold voltages) with power efficiencies exceeding 90%. However, load currents in a sub-threshold or near-threshold circuit may fall below 100 nA in a sleep mode, and the power efficiency of buck converter 26a could easily fall below 5%. In this sleep mode, it may be desirable to switch over to a second converter that offers better power efficiency. For example, linear voltage regulator 26b can be easily adapted to operate with quiescent current on the order of 1 nA yet be capable of delivering much great power efficiency with load currents on the order of 100 nA. Typically, such an embodiment of linear regulator 26b will be incapable of sourcing active load currents in the range of 100 μA to 5 mA, but automatic switchover to the buck converter 26a in active mode solves this problem.

It is common for microcontrollers ("MCUs") to have architected power states (e.g., an active state, a sleep state, a deep sleep state, etc.). Typically, such an MCU will have a power management unit ("PMU") that is responsible for switching between architected power states. Since the PMU is driving transitions between power states, it may also be used as the control 34 in FIG. 3 to drive transitions between voltage converters (e.g., from buck converter 26a to linear regulator 26b) in the converter 20.

As is known, transitions between voltage converters can also be driven by components in addition to the PMU. For example, a serial communications interface ("SCI") might remain active while the MCU is in a sleep state. Normally, linear regulator 26b would be enabled because the system 12 is in a sleep state. However, the SCI is still active and may require a high-performance converter like the buck converter 26a. Consequently, it may be desirable to permit the SCI to request that the buck converter 26a remain powered on and selected despite the system 12 transitioning to a sleep state.

Transitions between voltage converters can also be driven by current sense circuitry. For example, if a current sensor circuit (not shown) detects that the load current has fallen below some predetermined threshold, then the converter 20 can switch over from buck converter 26a, which has a high load capability, to linear regulator 26b, which has a low load capability.

Control of the converter 20 can be achieved via software, but this may sometimes be challenging and confusing for software developers. It may therefore be desirable to automate the transitions between voltage converters 26 based on the architectural power state of the system and based on the activity of peripherals in the system (e.g., the SCI).

While thus far focus has been on switching between converters 26, each individual converter 26[a::b] can also be designed to adapt to changing conditions and/or changing control signals. For example, buck converter 26a can change the on-time of the power switch transistor ("$T_{on}$") (not shown) depending on changing input value (i.e., conversion ratio), changing load current, a changing control signal, or a variety of other inputs. In contrast, linear regulator 26b can adapt the tail current of its main amplifier (not shown) depending on its load current, a changing control signal, or a variety of other inputs.

In some implementations, the converter 20 may not contain two separate converters 26. It may instead contain a single voltage converter 26 that adapts to the power state of the load circuit. For example, linear regulator 26b may be adapted to use a tail current of 1 μA in active mode to ensure adequate bandwidth for large active mode loads, while in sleep mode regulator 26b may be reconfigured to use a tail current of 1 nA.

The multiplexor 28 in FIG. 3 can be implemented using any known multiplexing technique including a pass transistor multiplexor, a transmission gate multiplexor, a wired-OR multiplexor implementation, and any of a variety of other known embodiments. The multiplexor 28 may also be designed to accommodate different timing relationships during switch-over from one converter 26 to another. The multiplexor 28 can pass the outputs of two converters 26 at once during switch-over from one converter to another to ensure a reliable output voltage. Conversely, the multiplexor 28 can block both converters 26 for a period of time when switching from one to another. The multiplexor 28 can also switch instantaneously from one to another.

It is typical for the converters 26 in FIG. 3 to share off-chip and on-chip passives (e.g., compensation capacitors) to save cost and area, though this is not required. In addition, converters 26 will generally share an input voltage, though they may also have different input voltages. Although converters 26 will generally provide the same output voltage, this is not required. For example, buck converter 26a used in active mode might provide a low voltage to minimize power while actively awake; but linear regulator 26b used in sleep mode might allow voltage to float higher since voltage level is not as important in sleep mode. Similarly, the converters 26 can have different compensation behavior. Thus, in the previous example, buck converter 26a might be temperature compensated while linear regulator 26b might not be temperature compensated at all.

As previously mentioned, an adaptive voltage supply is one of the best available tools to manage the exponential sensitivities of sub-threshold and near-threshold circuits. In one embodiment of the adaptive voltage converter 20, the $V_{Reg}$ voltage level is adjusted in response to different manufacturing process variations or environmental conditions. The tuning of the voltage level can be software controlled or can be controlled by a control circuit in a closed-loop fashion. The voltage level output by a particular converter 26 can be controlled by changing the reference voltage, the voltage converter gain, or any other available tuning parameter with respect to temperature and/or process.

In one embodiment, the $V_{Reg}$ voltage is dynamically adjusted as a function complementary to absolute temperature. Although the generation of such a function can be achieved in an open-loop manner with software that periodically measures temperature with a sensor (not shown), it may be desirable to construct a closed-loop circuit that requires no software intervention. For example, two-transistor sub-threshold reference voltage generator 36' shown in FIG. 4 can be easily adapted to adjust the $V_{Reg}$ voltage as a function complementary to absolute temperature simply by changing the size of one of the transistors M1-M2. Such an embodiment, used in the converter 20, automatically forces $V_{Reg}$ to vary as a function complementary to absolute temperature without software intervention.

The tuning of the voltage level with respect to variations in the manufacturing process is also important. In general, this tuning step is best done at the time of production test. Tuning parameters can be stored in an on-board non-volatile memory (not shown) and then loaded upon powering up for the first time. For chips that exhibit slow process characteristics (e.g., high threshold voltage or long gate length), the regulated voltage will generally be adjusted to a higher level to ensure a minimum performance level. Conversely, the regulated voltage will generally be adjusted down to save energy while maintaining performance for chips with faster process characteristics. Any known trimming algorithm may be used for determining the correct voltage level settings.

Though this discussion has focused mainly on the adaptation of supply voltage in response to temperature and process fluctuations, $V_{Reg}$ can also be adapted to other factors. For example, as the system's workload changes, $V_{Reg}$ can be changed accordingly. The system might remain in a sub-threshold or near-threshold low performance, low energy mode while handling background tasks like sensing and data movement. When handling applications with real-time requirements, the system might automatically increase voltage to a super-threshold voltage to achieve higher performance at the expense of energy efficiency.

Many of the aforementioned characteristics rely on tuning of the system 12 to minimize variations across process and temperature. This requires careful calibration at the time of post-manufacturing test. Manufacturing test requires a means to read out each important voltage, including reference voltages, internal nodes of feedback dividers, and regulated outputs. This is typically achieved by having an on-chip multiplexer (not shown) with a buffering amplifier (e.g., see FIG. 7 in the Related Application) that can alternately select each voltage of interest. Manufacturing test also employs a means to store calibrated values in a non-volatile manner on chip. This can be achieved using flash memory, one-time programmable memory, fuses, or any other means of non-volatile data storage. Any known trimming algorithm or method may be used to set the correct calibration settings for all previously discussed trimmable elements.

In accordance with the switch-over method illustrated in FIG. 5, when the load circuit 24 initially switches into the active mode, $V_{Reg}$ is sourced by buck converter 26a with high power efficiency and high current drive capability. When the load circuit 24 thereafter switches into sleep mode, control 34 powers up linear regulator 26b, which exhibits excellent low current drive capability and extremely low quiescent current. After giving the regulator 26b sufficient time to warm up, control 34 switches multiplexer 28 to source the load current from the linear regulator 26b. After a short delay, the control 34 powers down the buck converter 26a. Similarly, when the load circuit 24 switches into active mode, control 34 powers up buck converter 26a. After giving buck converter 26a time to warm up, control 34 switches multiplexer 28 to source the load current from the buck converter 26a. After a short delay, control 34 powers down the linear regulator 26b.

In one embodiment, $V_{Ref}$ generator 36 is tuned to have a low temperature coefficient ("TC") (i.e., a near-zero coefficient). In this embodiment, control 34 provides a first tuning parameter 38a to tune the absolute value of the reference across process; and a second tuning parameter 38b to tune out process variations in the temperature coefficient of the voltage reference.

Figure 6:
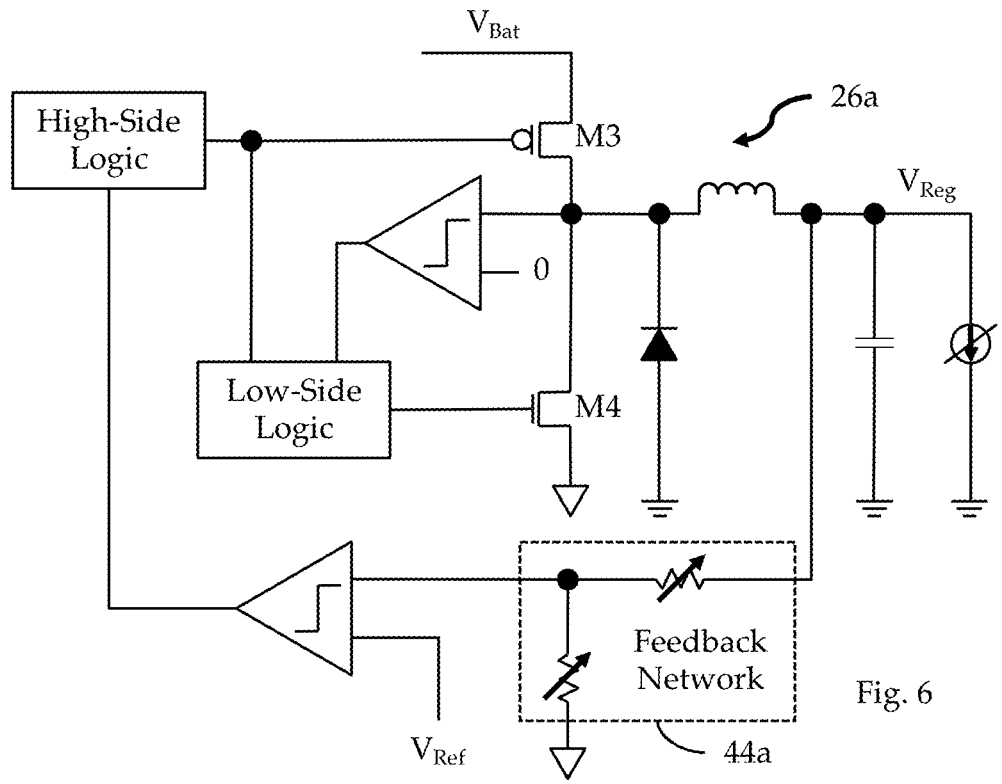
FIG. 6 illustrates, in circuit diagram form, one embodiment of a buck converter.

As illustrated in the embodiment illustrated in FIG. 3, buck converter 26a receives multiple control signals from control 34: a first signal 40a controls the absolute value of the feedback network's divide ratio; a second signal 40b controls the temperature co-efficient of the feedback divide ratio; and a third signal 40c controls whether buck converter 26a is powered up or powered down. A more detailed diagram of the buck converter 26a is shown in FIG. 6. The buck converter 26a uses a pulse frequency modulation scheme with transistors operating in a mix of sub-threshold, near-threshold and super-threshold regimes. The feedback network 44a is a resistive divider that is highly tunable, with a current source adapted to provide a bias current as a function that is positive to absolute temperature ("PTAT"). As previously stated, the first signal 40a is used to control the divide ratio to combat process variations, and the second signal 40b is used to control the temperature coefficient; both the first signal 40a and the second signal 40b are typically set during IC manufacturing, but, if desired, may be changed dynamically to adapt to current operating conditions. The temperature co-efficient is selected to ensure that $V_{Reg}$ varies as a function complementary to absolute temperature, thereby ensuring that sub-threshold and near-threshold circuits have operating speeds that remain substantially constant across temperature. The feedback network 44a, and, in particular, the PTAT current source, includes active amplifiers to ensure tunability of the temperature co-efficient. One suitable PTAT current source is the band-gap reference circuit shown in FIG. 11.18 on page 391 of *Design of Analog CMOS Integrated Circuits*, B. Razavi, McGraw Hill 2001.

Figure 7:
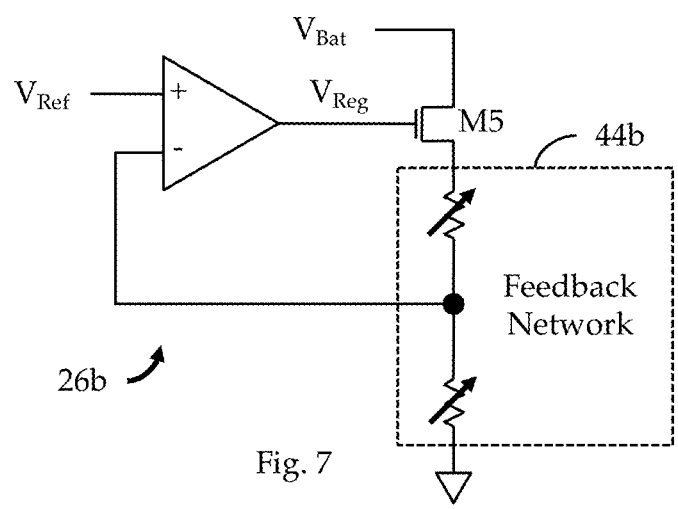
FIG. 7 illustrates, in circuit diagram form, one embodiment of a linear voltage regulator.
Figure 8:
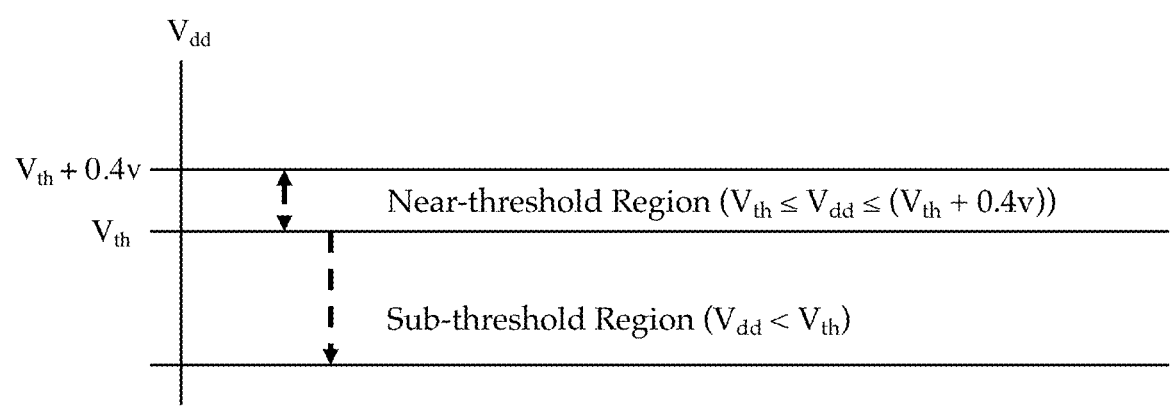
FIG. 8 illustrates, in graphical form, sub-threshold and near-threshold voltage ranges according to some embodiments.

As illustrated in the embodiment illustrated in FIG. 3, linear regulator 26b receives multiple control signals from control 34: a first signal 42a controls the absolute value of the feedback network's divide ratio; a second signal 42b controls the temperature co-efficient of the feedback divide ratio; and a third signal 42c controls whether linear regulator 26b is powered up or powered down. A more detailed diagram of the linear regulator 26b is shown in FIG. 7. The linear regulator 26b uses an amplifier biased in the sub-threshold region with tail current much less than 1 nA. Like the buck converter 26a, the linear regulator 26b has a feedback network 44b that is a highly tunable resistive divider. The first signal 42a is used to control the divide ratio to combat process variations, and the second signal 42b is used to control the temperature coefficient of the feedback divide ratio. The feedback network 44b includes active amplifiers to ensure tunability of the temperature co-efficient. This feedback network 44b can be shared with that of the buck converter 26a to save area and power. As in the case of the buck converter 26a, the temperature co-efficient is selected to ensure that $V_{Reg}$ varies as a function complementary to absolute temperature.

Although described in the context of particular embodiments, one of ordinary skill in this art will readily realize that many modifications may be made in such embodiments to adapt either to specific implementations.

Thus it is apparent that an adaptive voltage converter designed specifically to compensate for the exponential sensitivities of sub-threshold and near-threshold circuits has been disclosed. This adaptive voltage converter is also adapted to change its power/performance characteristics between different energy modes. Further, this method and apparatus provides performance generally superior to the best prior art techniques.

What is claimed is:

1. A voltage conversion method adapted to deliver to a load a regulated voltage, $V_{Reg}$, said method comprising the steps of:
developing a first tuning parameter and a second tuning parameter, said first tuning parameter being developed as a function of a process corner, and said second tuning parameter adjusts a complementary-to-absolute temperature coefficient of a sub-threshold regulated voltage, $V_{Sub}$, wherein $V_{Sub}$ is less than a selected transistor threshold voltage, $V_{th}$;
storing said first tuning parameter and said second tuning parameter;
developing a reference voltage, $V_{Ref}$ as a function of said first tuning parameter;
developing said sub-threshold regulated voltage, $V_{Sub}$, as a function of said second tuning parameter and of said reference voltage, $V_{Ref}$; and
selecting as said regulated voltage, $V_{Reg}$, said sub-threshold regulated voltage, $V_{Sub}$.

2. The method of claim 1 wherein said first tuning parameter adjusts an absolute value of said sub-threshold regulated voltage, $V_{Sub}$.

3. The method of claim 2 wherein said voltage conversion method is adapted to operate in a selected one of two current consumption modes.

4. A voltage converter facility configured to practice the method of claim 1.

5. An electronic system comprising a voltage converter facility according to claim 4.

6. A non-transitory computer readable storage medium storing computer readable instructions which, when executed in a processing system, causes the processing system to perform the steps of a method according to claim 1.

7. A voltage conversion method adapted to deliver to a load a regulated voltage, $V_{Reg}$, said method comprising the steps of:
developing a first tuning parameter and a second tuning parameter, said first tuning parameter being developed as a function of a process corner, and said second tuning parameter adjusts a complementary-to-absolute temperature coefficient of a near-threshold regulated voltage, $V_{Near}$, wherein $V_{Near}$ is greater than or equal to a selected transistor threshold voltage, $V_{th}$, and less than or equal to the sum of said selected transistor threshold voltage, $V_{th}$, and 0.4 volts;
storing said first tuning parameter and said second tuning parameter;
developing a reference voltage, $V_{Ref}$ as a function of said first tuning parameter;
developing said near-threshold regulated voltage, $V_{Near}$, as a function of said second tuning parameter and of said reference voltage, $V_{Ref}$; and
selecting as said regulated voltage, $V_{Reg}$, said near-threshold regulated voltage, $V_{Near}$.

8. The method of claim 7 wherein said first tuning parameter adjusts an absolute value of said near-threshold regulated voltage, $V_{Near}$.

9. The method of claim 8 wherein said voltage conversion method is adapted to operate in a selected one of two current consumption modes.

10. A voltage converter facility configured to practice the method of claim 7.

11. An electronic system comprising a voltage converter facility according to claim 10.

12. A non-transitory computer readable storage medium storing computer readable instructions which, when executed in a processing system, causes the processing system to perform the steps of a method according to claim 7.

13. In an adaptive voltage converter facility manufactured using a selected process having a process corner, a method comprising using the voltage conversion facility to perform the steps of:
developing a tuning parameter adapted to adjust a complementary-to-absolute temperature coefficient of a selected one of a sub-threshold regulated voltage, $V_{Sub}$, wherein $V_{Sub}$ is less than a selected transistor threshold voltage, $V_{th}$, and a near-threshold regulated voltage, $V_{Near}$, wherein $V_{Near}$ is greater than or equal to a selected transistor threshold voltage, Vth, and less than or equal to the sum of said selected transistor threshold voltage, $V_{th}$, and 0.4 volts; and
developing said selected one of a sub-threshold regulated voltage, $V_{Sub}$, and a near-threshold regulated voltage, $V_{Near}$, as a function of the tuning parameter.

14. The method of claim 13 wherein said tuning parameter varies as a function of the absolute value of the selected one of the regulated voltages, $V_{Sub}$ and $V_{Near}$.

15. The method of claim 13 further comprising using the voltage conversion facility to perform the steps of:
developing a second tuning parameter; and
developing said selected one of a sub-threshold regulated voltage, $V_{Sub}$, and a near-threshold regulated voltage, $V_{Near}$, as a function of the first and second tuning parameters.

16. A non-transitory computer readable storage medium storing computer readable instructions which, when executed in a processing system, causes the processing system to perform the steps of a method according to claim 13.

17. A voltage converter facility configured to practice the method of claim 13.

18. An electronic system comprising a voltage converter facility according to claim 17.

19. A method for developing a regulated voltage, Vdd, wherein Vdd is less than a selected transistor threshold voltage, Vth, said method comprising the steps of:
developing a first tuning parameter as a function of a process corner;
developing a second tuning parameter as a function complementary to absolute temperature;
storing said first and second tuning parameters;
developing a reference voltage, $V_{Ref}$ as a function of said stored first tuning parameter; and
developing said regulated voltage, Vdd, as a function of said stored second tuning parameter, and of said reference voltage, $V_{Ref}$.

20. The method of claim 19 wherein the step of developing a reference voltage, $V_{Ref}$ as a function of said stored first tuning parameter is further characterized as:
developing a reference voltage, $V_{Ref}$ as a function of said stored first tuning parameter and said stored second tuning parameter.

21. A method for use during the manufacture and operation of an integrated circuit for developing a regulated voltage, Vdd, wherein Vdd is less than a selected transistor threshold voltage, Vth, said method comprising the steps of:

during the manufacture of the integrated circuit:
- developing a first tuning parameter as a function of a selected process corner;
- developing a second tuning parameter as a function complementary to absolute temperature; and
- storing said first and second tuning parameters; and during the operation of the integrated circuit:
- loading said first and second tuning parameters;
- developing a reference voltage, VRef, as a function of said loaded first tuning parameter; and
- developing said regulated voltage, Vdd, as a function of said loaded second tuning parameter and of said reference voltage, VRef.

22. The method of claim 21 wherein the step of during the manufacture of the integrated circuit is further characterized as:

during a manufacturing test of the integrated circuit.

23. The method of claim 21 wherein the step of developing a reference voltage, $V_{Ref}$, as a function of said loaded first tuning parameter is further characterized as:

developing a reference voltage, $V_{Ref}$, as a function of said loaded first tuning parameter and said loaded second tuning parameter.

* * * * *